US009936569B2

(12) United States Patent
Liebert et al.

(10) Patent No.: US 9,936,569 B2
(45) Date of Patent: Apr. 3, 2018

(54) METHOD AND DEVICE FOR COOLING SOLDERED PRINTED CIRCUIT BOARDS

(71) Applicant: L'Air Liquide, Societe Anonyme pour l'Etude et l'Exploitation des Procedes Georges Claude, Paris (FR)

(72) Inventors: Holger Liebert, Dusseldorf (DE); Patrick Ridgeway, Niederkruchten (DE); Andre Kast, Ulm (DE); Laurent Coudurier, Dusseldorf (DE)

(73) Assignee: L'Air Liquide, Société Anonyme pour l'Etude et l'Exploitation des Procédés Georges Claude, Paris (FR)

( * ) Notice: Subject to any disclaimer, the term of this patent is extended or adjusted under 35 U.S.C. 154(b) by 817 days.

(21) Appl. No.: 14/354,296

(22) PCT Filed: Oct. 22, 2012

(86) PCT No.: PCT/EP2012/070842
§ 371 (c)(1),
(2) Date: Apr. 25, 2014

(87) PCT Pub. No.: WO2013/060635
PCT Pub. Date: May 2, 2013

(65) Prior Publication Data
US 2014/0290286 A1    Oct. 2, 2014

(30) Foreign Application Priority Data

Oct. 25, 2011 (EP) ..................................... 11186531
Nov. 10, 2011 (EP) ..................................... 11008959

(51) Int. Cl.
*H05K 1/00*  (2006.01)
*H05K 1/02*  (2006.01)
(Continued)

(52) U.S. Cl.
CPC ........... *H05K 1/0203* (2013.01); *B23K 1/008* (2013.01); *B23K 1/0016* (2013.01); *B23K 3/085* (2013.01)

(58) Field of Classification Search
CPC  B23K 1/012; B23K 3/085; F25D 3/10; F25D 3/11; F25D 13/06; H01K 1/203
See application file for complete search history.

(56) References Cited

U.S. PATENT DOCUMENTS 5,993,500 A * 11/1999 Bailey ................... B23K 1/008
                                                     228/42
6,780,225 B2 * 8/2004 Shaw ..................... B23K 1/012
                                                     219/388
(Continued)

FOREIGN PATENT DOCUMENTS

EP    2014401 A1    1/2009
JP    2002 141658    5/2002
(Continued)

OTHER PUBLICATIONS

PCT/EP2012/070842, International Search Report, dated Jan. 24, 2013 (2 pp).
(Continued)

*Primary Examiner* — Cassey D Bauer
(74) *Attorney, Agent, or Firm* — Elwood L. Haynes

(57) ABSTRACT

Method for cooling soldered printed circuit board modules in a cooling zone of a soldering system, wherein at least one cooling gas comprising inert gas is introduced into the cooling zone, wherein the printed circuit boards are conveyed continuously from a soldering zone of the soldering system into the cooling zone, wherein the cooling gas is generated using liquid cooling gas. The method according to the invention and the device (1) according to the invention advantageously permit highly efficient cooling of printed circuit board modules after the soldering process. The cool-
(Continued)

ing gas may advantageously be used for inerting the soldering system (2) after extraction from the cooling zone (15).

10 Claims, 4 Drawing Sheets

(51) Int. Cl.
*B23K 1/00* (2006.01)
*B23K 1/008* (2006.01)
*B23K 3/08* (2006.01)

(56) References Cited

U.S. PATENT DOCUMENTS

| | | | |
|---|---|---|---|
| 2002/0178705 A1* | 12/2002 | Mullins | B01D 46/02 55/385.2 |
| 2008/0006294 A1 | 1/2008 | Saxena et al. | |
| 2008/0295686 A1* | 12/2008 | Neiderman | B23K 1/008 95/39 |

FOREIGN PATENT DOCUMENTS

| | | |
|---|---|---|
| JP | 2003 181682 | 7/2003 |
| JP | 2010 012476 | 1/2010 |
| WO | WO 9920425 A1 | 4/1999 |

OTHER PUBLICATIONS

EP 11186531.7, Search Report, dated Apr. 10, 2012 (5 pp).
EP11008959.6, Search Report, dated May 2, 2012 (5 pp).

* cited by examiner

METHOD AND DEVICE FOR COOLING SOLDERED PRINTED CIRCUIT BOARDS

CROSS REFERENCE TO RELATED APPLICATIONS

This application is a 371 of International Application PCT/EP2012/070842 filed Oct. 22, 2012, which claims priority to European Application No. 11186531.7 filed Oct. 25, 2011, and European Application No. 11008959.6 filed Nov. 10, 2011, the entire contents of which are incorporated herein by reference.

BACKGROUND

The present invention relates to a method and a device for cooling soldered printed circuit board modules in a cooling zone of a soldering system, wherein a gas is used to cool the soldered printed circuit board modules. Use of the method according to the invention and the device according to the invention in reflow soldering systems and/or wave soldering systems is preferred.

Soldering systems for soldering printed circuit board modules conventionally have a preheating zone, a soldering zone and a cooling zone. In the preheating zone, the components to be soldered are heated to a temperature just below the melting temperature of the solder, and in the soldering zone the temperature is raised to or above the melting temperature of the solder. In the cooling zone, cooling of the soldered printed circuit board modules takes place. Conventionally, the printed circuit board modules are passed successively through the individual zones.

In the cooling zone, cooling systems which are based on mechanical cooling and cold transmission by means of a coolant are conventionally used. Such cooling systems, which are operated for example with cooling water, are very energy-intensive to operate and not very efficient, and are therefore cost-intensive. In particular, the lack of energy efficiency is also disadvantageous in view of the resulting additional burden on the environment.

On the basis of this, it is an object of the present invention to provide a method and a device for cooling soldered printed circuit board modules, by which the disadvantages known from the prior art are at least partially overcome.

These objects are achieved by the independent claims. The respective dependent claims related to advantageous refinements.

Advantageous refinements are also provided by features disclosed in the description or in the figures, which may be combined with one another and with features from the claims in any technologically appropriate manner.

SUMMARY

According to the method according to the invention for cooling soldered printed circuit board modules in a cooling zone of a soldering system at least one cooling gas comprising an inert gas is introduced into the cooling zone wherein the printed circuit boards are conveyed continuously from a soldering zone of the soldering system into the cooling zone, wherein the cooling gas is generated using liquid cooling gas.

The generation of the cooling gas from liquid cooling gas means e.g. that the liquid cooling gas is (partly) evaporated e.g. in a heat exchanger or heat sink or is evaporated in a mixer or is introduced into the cooling zone of a soldering system. In particular, the cooling gas is introduced entirely in the liquid phase, although a mixture of liquid and gaseous phases may also be introduced. The cooling gas is thus, in particular, not fully vaporized before introduction. The cooling zone of a soldering system in the context of the present invention includes all components which are assigned to the cooling zone as well as the gaseous cooling atmosphere, delimited by the components, through which the printed circuit board modules are passed. The cooling zone encompasses a heat exchanger as well in which liquid cooling gas is (partly) evaporated. This heat exchanger can be used to cool the cooling atmosphere in the cooling zone by either being in direct thermal contact to the cooling zone or by providing chill to the cooling atmosphere before being introduced into the cooling zone or in a circuit flow. Owing to the use of liquid inert gas, the enthalpy of vaporization of the liquid inert gas can be used at least partially for cooling the printed circuit board modules. An efficient method is thereby provided, since additional energy does not have to be expended in order to vaporize the liquid cooling gas. In this way, inefficient mechanical cooling systems can be greatly enhanced or replaced. The continuous conveyance of the printed circuit board modules is understood in such a way that the modules are transported continuously from the soldering zone (which is denoted as the peak zone as well) to the cooling zone, preferably from a preheating zone to the soldering zone as well, and in particular using a single conveyer which passes through all these zones or several conveyors which are connected in such a way that a continuous conveyance of the modules is guaranteed. The conveyors can be driven with different speeds. It is possible that several conveyors are situated parallel. Therefore, each zone comprises several parallel conveying paths for the printed circuit boards.

The concept of a continuous conveyance of the printed circuit board modules from the soldering zone to a cooling zone (and from a preheating zone to the soldering zone) is only possible if these zones are not divided and/or separated by walls and/or doors. Therefore, these zones share a common room. In order to have different atmospheres in the respective zones, which is sometimes desired, it is necessary to introduce gases for these atmospheres in the different zones to ensure local different or desired atmospheres. This can be improved by providing gas guiding means e.g. in the form of curtains which do not comprise a gas tight division of the several zones of the soldering apparatus.

In an alternate embodiment to the method according to the present invention a method for cooling soldered printed circuit board modules in a cooling zone of a soldering system by a cooling gas comprising at least one inert gas is proposed in which the cooling gas is generated by mixing the inert gas in a gaseous state and in a liquid state in a static mixer, wherein the temperature of the cooling gas downstream of the mixer is monitored and is used as a control variable for the amount of liquid inert gas to be introduced into the mixer. This alternate embodiment can be combined with any advantageous embodiment of the invention described above, said embodiments being disclosed in this text and is in particular suitable for a continuous conveyance of the modules through the zones as well.

Since an inert gas is often used in soldering processes for inerting the soldering system, the spent gas, i.e. the cooling gas after fulfilling the cooling function, may advantageously be introduced as inert gas into the soldering system and used there for inerting the atmosphere in the soldering system. To facilitate this the cooling gas is guided from the cooling zone to e.g. the preheating zone, the soldering zone and/or to a condenser unit for condensing undesired substances in the process gas and/or exhaust gas of the soldering process. In general it is additionally or alternatively preferred to use the off-gas of heat exchangers in which liquid cooling gas like liquid nitrogen is at least in part evaporated for other purposes, in particular the purposes mentioned before. In addition, a buffer volume for storing completely evaporated cooling gas can be provided in order to supply inert gas to other processes such as e.g. wave soldering or selective soldering processes. In case of other processes which might need higher pressure levels a compression pump might be added frontline of the process to achieve pressure build up.

By enhancing or obviating mechanical cooling systems which use coolants, environmentally friendlier operation of the system is possible. It is possible to combine the system as described above with a water based cooling system for cooling the cooling zone by using cooling water. Here, the liquid cooling gas and in particular its evaporation enthalpy can be used to cool the cooling water in a respective heat exchanger. In the case of cold gas cooling to enhance conventional cooling systems energy savings can be achieved, and new systems can be dimensioned smaller. When replacing the mechanical cooling system, besides a 100% energy saving on operation of the system, environmentally harmful coolants which currently have to be disposed of are avoided, for example ammonia or hydrocarbons. Relatively elaborate regular servicing/maintenance operations on the mechanical cooling system, which currently can often only be carried out by specialized companies owing to the coolants involved, are obviated.

In one configuration of the invention, the cooling gas is obtained by mixing the gaseous and liquid inert gas.

This means that a cold gas, which may optionally contain liquid inert gas components, can be used as cooling gas for cooling the printed circuit board modules. By mixing liquid and gaseous inert gas, the enthalpy of vaporization of the liquid inert gas, or the specific heat capacity of the mixed cold gas, can partially be used for cooling the printed circuit board modules. By expedient mixing of liquid inert gas and gaseous inert gas, it is also possible to achieve a predeterminable temperature of the cooling gas.

According to an advantageous configuration of the method, the cooling gas is introduced into the cooling atmosphere of the cooling zone.

The cooling gas is preferably introduced at a predeterminable temperature into the cooling atmosphere and flows around the soldered printed circuit board modules. Since, above all directly downstream of the soldering zone, these are still at a relatively high temperature, by an inert gas as the cooling gas the cooling atmosphere of the cooling zone is simultaneously inerted and oxidative reactions on the still hot just soldered printed circuit board module is prevented, particularly in the region of the solder. Furthermore, alloying effects can be avoided and unperturbed growth of intermetallic phases is promoted. By the method according to the invention, it is possible to achieve maximum possible cooling of the printed circuit board modules, for example by setting up the maximum possible temperature gradient of the soldered components. In this way, overall, more effective cooling can take place and the cooling zone can be made shorter than in the case of mechanical cooling with a coolant. Alloying effects are furthermore avoided and structural strengthening at the solder position takes place by grain size reduction. The microhardness of the solder positions is increased by the method according to the invention in comparison with methods known from the prior art.

It is in particular possible, to provide the cooling atmosphere with a significant amount of liquid cooling gas above and/or below the conveyor. The cooling gas is preferably introduced using the pressure of liquid cooling gas like liquid nitrogen and/or using a gas as a delivery medium to deliver the cooling gas. The delivery medium can, in particular, be the off gas of a heat exchanger used in the process where liquid cooling gas (like liquid nitrogen) is evaporated. The cooling gas can be provided directly on the printed circuit boards to be cooled. Alternatively or additionally the cooling gas can be provided as a spray into the cooling atmosphere, preferably in the whole cooling zone. Furthermore, the directly injected amount of cooling gas like nitrogen provides an additional inerting effect on upfront processes of the soldering zone.

According to another configuration of the method, the cooling gas is passed through a heat sink which is assigned to the cooling zone. The heat sink is, in particular, in direct heat exchange with the cooling atmosphere of the cooling zone.

The term heat sink in the context of this document covers a heat exchanger as well. This likewise permits effective cooling and has the advantage that, particularly in the case of legacy systems which already have heat sinks, through which a coolant such as water previously flowed, these can optionally be used and cooling gas can flow through them. It is in particular advantageous to use cryogenic temperature resistant heat exchangers. Furthermore, the heat sink has a substantially uniform temperature. Owing to the fact that the coolant is not applied directly to the printed circuit board modules, undesired temperature gradients do not occur and uniform cooling of the printed circuit board modules is achieved. Here again, use of the corresponding spent gas as an inert gas in the soldering system, for example in the cooling zone, the preheating zone, the soldering zone and/or in a condenser unit for condensing undesired substances in the process gas and/or exhaust gas of the soldering process is advantageously possible.

Preferably, the cooling atmosphere cooled by the heat sink is circulated in the cooling zone. A uniform temperature distribution is thereby achieved in the cooling zone. In this context, it is possible in particular for the heat sink to be arranged in a flow channel, which forms a circuit with the cooling atmosphere in the immediate vicinity of the printed circuit board modules. In this case, heat is transferred to the cooling gas in the flow channel and the cooling atmosphere is uniformly cooled. Particularly preferably, in this case cooling first takes place with a conventional cooling system and subsequently cooling by means of the heat sink, in which liquid cooling gas is fed.

Furthermore, it is also preferable for the printed circuit board modules to be conveyed directly above and/or below the heat sink. The heat sink is thus arranged in the immediate vicinity of the printed circuit board modules, so that the temperature in this region can be varied locally, which is advantageous particularly in the case of a desired temperature change. Since the heat sink has a thermal inertia, a predeterminable temperature can be adjusted with ease.

Control of the amount of cooling gas flowing through the heat sink is achieved by at least one of the following parameters as a controlled variable:
temperature,
pressure,
volume flow rate.

A further option of a controlled variable is the residual oxygen level e.g. in the preheating and/or soldering zone, e.g. as a minimum level, if the cooling gas is used to as inert gas in at least one of these zones. Furthermore, if nitrogen is used as a cooling gas which is generated from liquid nitrogen the nitrogen can be used to lower the water content in the atmosphere e.g. in the preheating zone, the soldering zone and/or the cooling zone as the water content of liquid nitrogen is negligible. Therefore, condensation problems frequently present in soldering processes can be reduced or solved.

According to an advantageous embodiment at least one of the following elements: at least one fan being assigned to a specific area of the cooling zone and at least one heat sink to cool the cooling atmosphere provided to the cooling zone are controlled to provide a cooling atmosphere in the cooling zone with a predetermined temperature gradient.

Control of a fan can be performed by controlling the rotation frequency of the fan. Control of a heat sink can be performed by adjusting the mass flow of heat exchange medium passing through the heat sink and/or the mass flow of the cooling atmosphere passing the heat sink. It is particularly preferred that each fan and/or each heat sink can be controlled individually. In general it is possible when using at least two heat sinks or heat exchangers to use the exhaust of the heat exchange medium (e.g. nitrogen) as an exchange medium in a consecutive heat sink.

According to an advantageous configuration of the method, the cooling gas, after at least one of the following flow paths:
after flowing through the cooling zone and
after flowing through the at least one heat sink,
is fed to at least one of the following zones as inert gas:
a soldering zone, in which a soldering process is carried out on the printed circuit board modules; and
a preheating zone, in which the printed circuit board modules are preheated before reaching the soldering zone.

Additionally or alternatively it is possible to use the cooling gas after flowing through the cooling zone and/or after flowing through the at least one heat sink to drive a condenser unit for condensing undesired substances in the process gas and/or exhaust gas of the soldering process.

The spent gas of the cooling process can therefore be used for inerting the soldering zone and/or the preheating zone and/or to drive a condenser unit for cleaning the process and/or exhaust gas of the soldering process. Conventionally, the preheating zone, soldering zone and cooling zone are separated from one another by suitable measures, in order to prevent the gas flowing from one zone to another zone. This is achieved, for example, by suitable zonal atmosphere delivery into the individual zones, which in this regard may also respectively comprise subzones. As a result, it is also possible to achieve thermal separation of the individual zones or subzones. As an alternative or in addition, suitable heat-resistant means may be formed in order to separate the zones or subzones from one another, for example corresponding curtains.

According to an advantageous configuration, it is in this case possible to heat the inert gas to a predeterminable hot temperature after flowing through the cooling zone and/or after flowing through the heat sink.

This may be done using an electrical heater or by heat transfer from a heating medium. In this way, the inert gas may be used to heat the preheating and/or soldering zone, or it may help to maintain the temperature in this region. In particular, it is possible to regulate the temperature in the preheating and/or soldering region by heating to the respective predetermined temperature.

According to another configuration of the method, the mixing of liquid and gaseous inert gas takes place in a static mixer.

A static mixer advantageously permits effective mixing of liquid and gaseous inert gas to form cooling gas, without further moving parts being required. Conventionally, for example, a liquid inert gas, for example nitrogen, is stored in a tank at a relatively high pressure of e.g. 12 bar, so that it is possible to use this pressure in order to deliver the inert gas in liquid form to the mixer and to enhance the mixing process.

According to an advantageous configuration of the method, the temperature of the cooling gas is monitored downstream of the mixer and used as a controlled variable for the quantity fraction of liquid inert gas to be added.

With the aid of a value, namely the quantity or mass fraction of liquid inert gas in the cooling gas, which is produced by corresponding mixing of liquid and gaseous inert gas, it is thus possible to set and adjust the temperature of the cooling gas. It has been found that this controlled variable can be used simply and reliably in a corresponding control loop.

According to another advantageous configuration of the method, at least one of the following temperatures:
the temperature in the cooling atmosphere,
the temperature of the cooling gas vaporized in the heat sink and emerging from the latter,
the temperature of the cooling gas during delivery into the cooling zone; and
the temperature of the cooling gas during delivery into the heat sink, is used as a controlled variable for at least one of the following quantities:
the volume flow rate of the cooling gas to be delivered into the cooling zone;
the volume flow rate of cooling gas into the heat sink;
the quantity fraction of liquid inert gas to be added when mixing the cooling gas; and
the quantity fraction of gaseous inert gas to be added when mixing the cooling gas.

It is thus possible to set the temperature in the cooling zone directly as a controlled variable for regulating the corresponding volume flow rates of the cooling gas flowing into the cooling zone or the volume flow rate of cooling gas into the heat sink. The temperature can thus be adjusted directly, which allows maximally efficient cooling of printed circuit board modules after leaving the soldering zone.

This control mechanism can be realized independent from the kind of transport of the printed circuit board modules. This means, the control mechanism can be combined with a method for cooling soldered printed circuit board modules in a cooling zone of a soldering system by at least one cooling gas comprising inert gas, wherein liquid cooling gas is introduced into the cooling zone. The features of the advantageous embodiments of the claims and the specification in general can be combined with this method as well disclosing advantageous embodiments of this invention.

According to an advantageous configuration of the method according to the invention, the temperature to which the printed circuit board module is cooled is regulated by varying at least one of the following parameters:
the volume flow rate of cooling gas flowing through the heat sink,
the speed with which the printed circuit board modules are conveyed past the heat sink,
the speed with which the cooling atmosphere is circulated in the cooling zone.

The speed with which the cooling atmosphere is circulated can be varied e.g. by varying the rotation frequency of at least one fan by which the cooling atmosphere is circulated in and/or provided to the cooling zone. Alternatively or additionally at least one heat sink or heat exchanger can be controlled accordingly. It is possible by these measures to create a predetermined temperature gradient in the cooling zone.

According to another configuration of the method, at least one of the following gases is used as the inert gas:
nitrogen;
argon;
helium and
carbon dioxide.

In particular, the use of nitrogen has proven advantageous since nitrogen is available with high purity and is economical for the user of the method. Furthermore, the use of nitrogen is environmentally friendly and it is already regularly used as an inert gas in a soldering process, so that a double use may optionally be exploited here, so that the efficiency of the process with respect e.g. to energy consumption, process costs is further increased. Furthermore, the low water content of nitrogen, in particular when being evaporated from the liquid state, can be used to provide a dry atmosphere e.g. when using the nitrogen to provide and maintain an inert atmosphere in the preheating and/or soldering zone. Helium leads to good heat transfer and thus allows particularly effective cooling.

Another aspect of the present invention provides a device for cooling soldered printed circuit board modules, which comprises a source of liquid cooling gas, a soldering system having a soldering zone for soldering the printed circuit board modules, a cooling zone and a cooling gas line, the source of liquid cooling gas and the cooling zone being connected together by the cooling gas line, no heat source for supplying heat into the cooling gas line being arranged in the cooling gas line, so that liquid cooling gas from the source of liquid cooling gas can be introduced into the cooling zone, further comprising at least one transport device for conveying the printed circuit board modules continuously through the soldering zone and the cooling zone.

In the context of the present invention, heat sources are intended to mean devices which supply heat energy to the cooling gas conveyed in the cooling gas line. They mean, in particular, heating wires or similar electrically operated devices and/or the ambient atmosphere. The supply of cooling gas with a relatively higher temperature to the liquid cooling gas is likewise not regarded as a heat source in the context of the present invention. The cooling gas line is configured so that at least some of the cooling gas, preferably all of the cooling gas, reaches the cooling zone in the liquid state. It is thus, in particular, necessary to form a cooling gas line between the source of liquid cooling gas and the cooling zone. In this case, it is unimportant whether a heat source is formed in another line between the source of liquid cooling gas and the cooling zone.

The device preferably comprises a mixer for mixing gaseous and liquid inert gas, which comprises a gas connection for supplying gaseous inert gas, a liquid connection for supplying liquid inert gas and a cooling gas outlet, which can be connected to the cooling zone.

Such a device may particularly preferably be used for carrying out the method according to the invention and adapted to use of the method according to the invention. In this case, it is advantageous for the cooling gas outlet to be connectable fluidically either to a gas inlet of the cooling zone and/or connectable fluidically to an inlet of a heat sink.

One configuration of the device furthermore comprises:
a liquid gas valve for dosing the liquid inert gas to the mixer;
a gas valve for dosing the gaseous inert gas to the mixer; and
a control unit, suitable and adapted for carrying out the method according to the invention, which is connected to the liquid gas valve and the gas valve so that at least actuation of the liquid gas valve and of the gas valve can be carried out by the control unit.

According to another configuration, a temperature sensor for measuring the temperature is formed at the cooling gas outlet.

In particular a resistive sensor, for example a platinum-based resistive sensor, may be used as the temperature sensor.

According to another configuration of the device, at least one heat sink connected to the cooling gas line is formed. This heat sink is a part of a soldering system and is formed in the cooling zone therein.

Preferably, the at least one heat sink is arranged in at least one of the following positions in the cooling zone:
above the transport device,
below the transport device,
in a flow channel for gases of a cooling atmosphere of the cooling zone, the cooling atmosphere being circulatable through the flow channel,
in an external or internal process water cooler.

According to another configuration of the device, the mixer is a static mixer.

A static mixer has been found to be particularly advantageous for mixing liquid inert gas and gaseous inert gas.

Furthermore, it is preferred to provide at least one, in particular all, couplings in which lines for guiding cooling gas in liquid or gaseous state in the device according to the present invention with a housing being flown through by gaseous cooling agent, preferably nitrogen, to avoid condensation and freezing of water in the ambient atmosphere and to suppress the entering of water from the ambient atmosphere through the couplings into the cooling gas in the system. The same approach can be used to keep a heat exchanger dry or at other parts of the apparatus where e.g. due to contact with the ambient atmosphere condensation could occur.

The details and advantages disclosed for the method according to the invention can be adapted and applied to the device according to the invention, and vice versa. The invention will be explained in more detail below with the aid of the appended figures, but without being restricted to the details and exemplary embodiments shown therein. By way of example and schematically:

DESCRIPTION OF PREFERRED EMBODIMENTS

Figure 1:
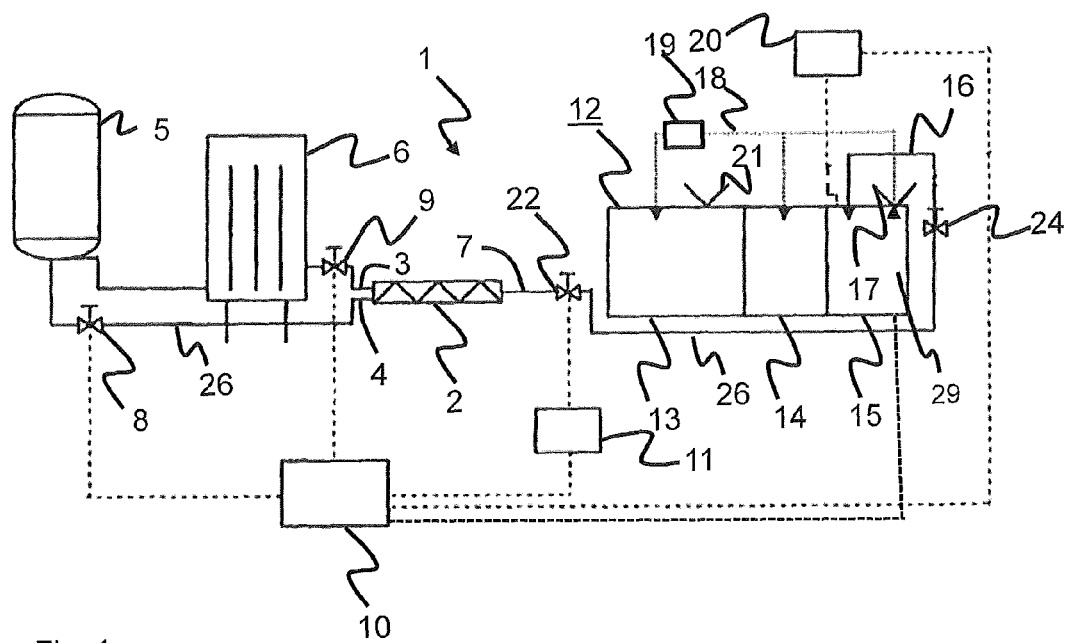
FIG. 1: shows a first example of a device for cooling printed circuit board modules.

FIG. 1 shows a first example of a device 1 for cooling printed circuit board modules (not shown). The device 1 comprises a mixer 2 for mixing gaseous and liquid inert gas, in the present example nitrogen. The details disclosed here may, however, also readily be applied to other inert gases. The mixer 2 is a static mixer and comprises a gas connection 3 for supplying gaseous inert gas and a liquid connection 4 for supplying liquid inert gas. In the mixer 2, liquid nitrogen from a nitrogen reservoir 5, which contains liquid nitrogen, and gaseous nitrogen are mixed. The latter is generated in an evaporator 6 into which liquid nitrogen flows from the nitrogen reservoir 5. As an alternative or in addition, it is also possible to supply gaseous nitrogen from different sources, for example corresponding compressed gas containers, for example gas cylinders, or on site gas generators. Alternatively, or additionally, it is possible to replace the evaporator 6 by a water bath heat exchanger, or to add such a heat exchanger. Thus, as heated water of existing mechanical water based cooling systems can be cooled down by the evaporation enthalpy of the liquid cooling gas like liquid nitrogen an added value is generated. Thus, the water bath heat exchanging system can be used as a centralized or decentralized system. Decentralized meaning a system being part of the soldering apparatus equipment. Centralized meaning from a central gas storage tank. Although here the created gas can be used for inerting. In case of a process using a defined cold gas with a determined temperature this gas flow can be generated by the water bath heat exchanger.

The nitrogen reservoir 5 is connected to the liquid connection 4 of the mixer 2 and the evaporator 6 is connected to the gas connection 3 of the mixer 2. The mixer 2 furthermore comprises a cooling gas outlet 7 through which the cooling gas, which results from the mixing of liquid and gaseous nitrogen, leaves the mixer 2. The mixer 2 is therefore arranged in a cooling gas line 26, which fluidically connects the nitrogen reservoir to a cooling zone 15 of the soldering system 12.

The temperature of the cooling gas can be set, in particular by means of the quantity ratio of liquid and gaseous nitrogen. Depending on the temperature which is set, the cooling gas contains greater or lesser proportions of liquid nitrogen. The quantity of liquid nitrogen can be controlled by means of a liquid gas valve 8, while the quantity of gaseous nitrogen can be controlled by means of a gas valve 9. The liquid gas valve 8 and the gas valve 9 are connected via data lines (indicated here by dots) to a control unit 10, which is suitable and adapted for carrying out the method according to the invention. The quantity of liquid and/or gaseous inert gas to be supplied is determined in the control unit 10 on the basis of the data of a first temperature sensor 11 and/or a second temperature sensor 20, and the liquid gas valve 8 and the gas valve 9 are driven accordingly in a controlled way by the control unit 10 in order to adapt the necessary volume flow rates. The control unit 10 is furthermore connected to two cooling gas valves 24, by means of which the flow of cooling gas can be controlled.

A controller of a soldering system 12 may also be part of the control unit 10. Thus, in particular, it is possible when controlling the soldering system 12 to set temperature profiles for the individual zones of the soldering system, which may for example be selected on the basis of the product to be soldered. To this end, corresponding data lines may optionally be formed between the control unit 10 and the soldering system 12.

The device 1 furthermore comprises a first temperature sensor 11, by which the temperature at the cooling gas outlet 7 can be determined. FIG. 1 furthermore shows a soldering system 12 for soldering electronic components to a printed circuit board, so-called printed circuit board modules. In this representation, the printed circuit board modules are transported from left to right through the soldering system 12, preferably on a conveyor belt (not shown here). In this example, the soldering system 12 comprises a preheating zone 13, a soldering zone 14 and a cooling zone 15, in which a cooling gas atmosphere 29 is formed. In the preheating zone 13, the printed circuit board modules are preheated until in the soldering zone 14 they reach or exceed the melting temperature of the solder and can be brought in contact with the solder. In the cooling zone 15, the printed circuit board modules provided with solder are cooled again. In this and the following examples the printed circuit board modules are preferably conveyed continuously through the preheating zone 13, the soldering zone 14, and the cooling zone 15. In so far the limitations shown in the figures between the zones 13, 14, 15 are only to display the boundaries between the zones and do not constitute walls. The invention may be adapted and used for alternative soldering concepts, for example wave soldering systems and other soldering methods.

During operation, cooling gas consisting of liquid and gaseous inert gas, here for example nitrogen, is generated in the mixer 2. The nitrogen is transported out of the mixer 2 through the cooling gas outlet 7. Through a cooling gas supply line 16, the resulting cooling gas is introduced into the cooling zone 15. Liquid inert gas possibly still remaining evaporates at the latest in the cooling zone 15, so that the resulting enthalpy of the vaporization can also be used to cool the printed circuit board modules. Excess cooling gas atmosphere is extracted from the cooling zone 15 through a cooling zone spent gas outlet 17 and supplied via an inert gas supply line 18 to the preheating zone 13 and the soldering zone 14 for inerting. The inert gas may in this case be heated by heating means 19, if necessary. By means of a second temperature sensor 20, the temperature of the cooling gas in the cooling gas supply line 16 or in the cooling zone 15 may optionally be monitored. The second temperature sensor 20 is likewise connected via a data line (represented by dots) to the control unit 10. Through a preheating zone spent gas outlet 21, the spent gas is discharged from the preheating zone 13 and optionally from the soldering zone 14.

The use of cold gas for cooling the printed circuit board modules in the cooling zone 15 of the soldering system 12 is advantageous since more efficient cooling can thus be achieved compared with indirect cooling using a coolant as a heat-transfer medium and corresponding heat exchangers. Thus, optimal cooling of the modules can take place with a larger temperature gradient than with conventional cooling. The temperature of the cooling gas, which is introduced into the cooling zone 15, can be set and can be adjusted by the quantity ratio of liquid and gaseous inert gas in the mixer 2. In particular the maximum possible temperature gradient, which the printed circuit board modules or the soldered electronic elements can experience without damage, can also be achieved by corresponding cooling to low temperatures, so that the fast as possible cooling can be achieved.

Figure 2:
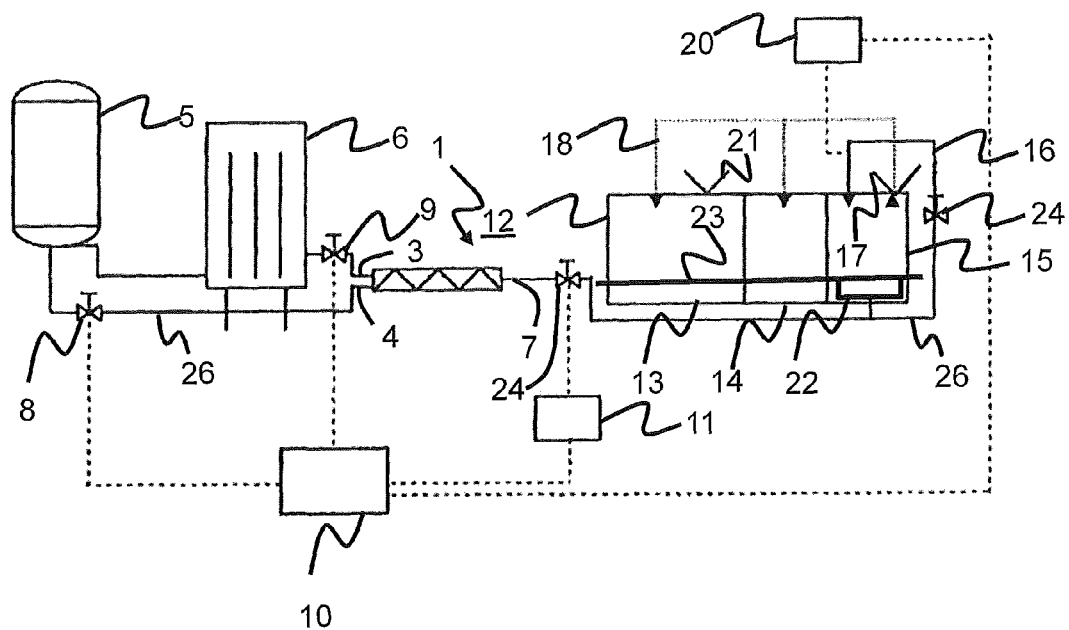
FIG. 2: shows a second example of a device for cooling printed circuit board modules.

FIG. 2 shows a second example of a device 1, much of which is identical to the first example as shown in FIG. 1. Only the differences from the first example will therefore be discussed here; in other regards, reference is made to the description of FIG. 1. In addition to supplying the cooling gas to the cooling zone 15, in this example part of the cooling gas is delivered to a heat sink 22. This may also be carried out as an alternative to supplying the cooling gas into the cooling zone 15. The heat sink 22 is formed below a transport device being a conveyor belt 23 of the soldering system 12, so that the printed circuit board modules can be transported past the heat sink 22 during operation. The conveyor belt 23 passes through the preheating zone 13, the soldering zone 14, and the cooling zone 15 allowing a continuous transport of the printed circuit board modules through the zone 13, 14, 15.

In this way, a significant improvement of the cooling efficiency can be achieved in legacy systems, for example by converting existing heat sinks 22 for the method according to the invention or by only minor refits being necessary. Cooling by means of a heat sink 22 allows very uniform cooling of the printed circuit board modules, so that thermal stresses induced during the cooling are only formed to a minor extent.

Figure 3:
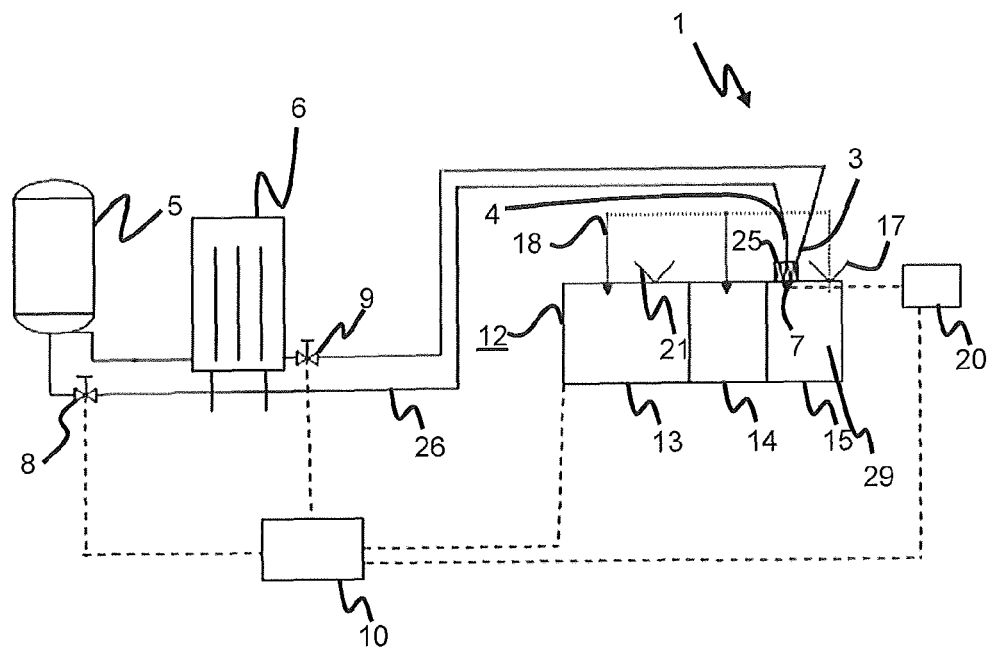
FIG. 3: shows a third example of a device for cooling printed circuit board modules.

FIG. 3 shows a third example of a device 1. In contrast to the examples of FIGS. 1 and 2, a central mixer 2 which may optionally be used together for a plurality of soldering systems 12, for example when the same products are being soldered in a plurality of soldering systems 12, is not formed here; rather a decentral mixer 25 is used which is formed directly in or very close to a cooling zone 15 and is only used for a single soldering system 12 and a cooling zone 15 thereof. The decentral mixer 25 may preferably comprise a fan which ensures a certain flow of the cooling gas in the cooling zone 15. Excess cooling gas atmosphere is extracted from the cooling zone 15 through a cooling zone spent gas outlet 17 and supplied via an inert gas supply line 18 to the preheating zone 13 and the soldering zone 14 for inerting. Through a preheating zone spent gas outlet 21, the spent gas is discharged from the preheating zone 13 and optionally from the soldering zone 14.

The decentral mixer 25 comprises a gas connection 3 and a liquid gas connection 4, which are connected via a gas valve 9 and liquid gas valve 8 to the nitrogen reservoir 5 and the evaporator 6. Mixing of gaseous and liquid inert gas takes place in the mixer 25, and the cooling gas is introduced directly into the cooling zone 15 through the cooling gas outlet 7. The gas valve 9 and the liquid gas valve 8 are connected via data lines (indicated here by dots) to a control unit 10, which is suitable and adapted for carrying out the method described above. The control unit 10 is furthermore connected to a second temperature sensor 20, which determines the temperature of the cooling gas flowing into the cooling zone 15 from the mixer 25 and is used as a controlled variable for the quantity of liquid nitrogen to be supplied, the quantity of gaseous nitrogen to be supplied and/or the quantity of cooling gas to be supplied into the cooling zone 15.

Figure 4:
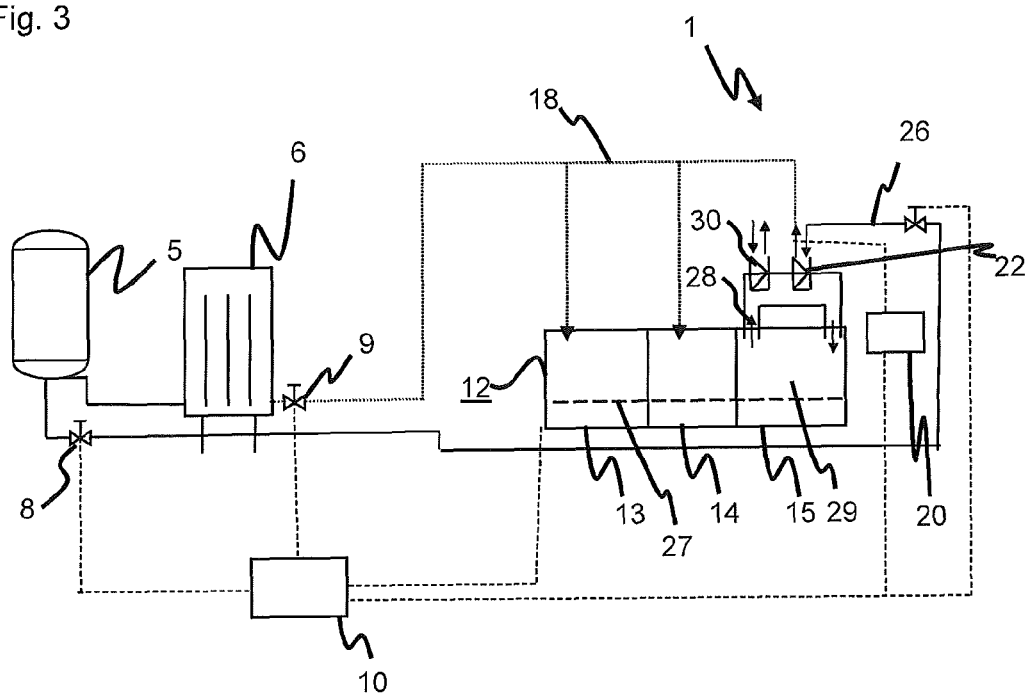
FIG. 4: shows a fourth example of a device for cooling printed circuit board modules.
Figure 5:
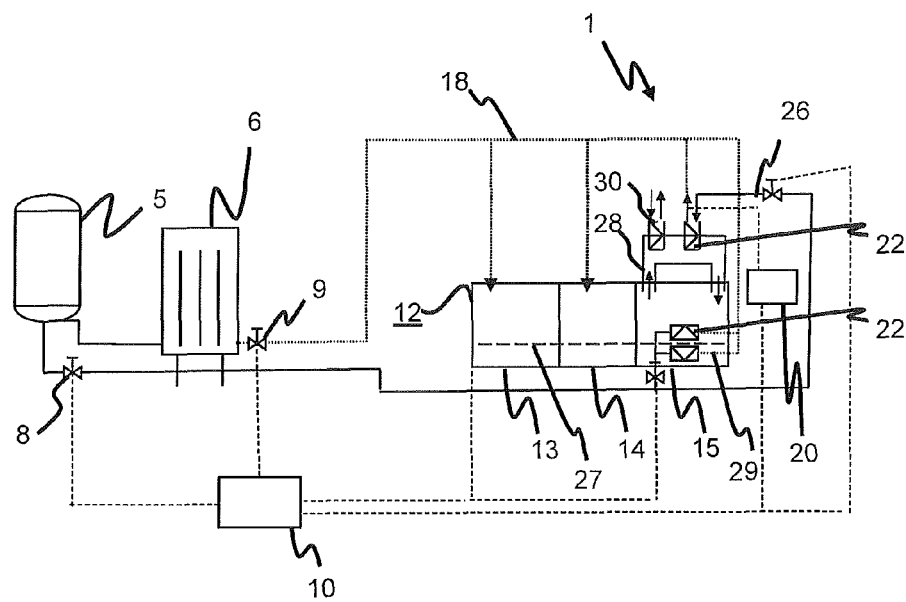
FIG. 5: shows a fifth example of a device for cooling printed circuit board modules.

FIG. 4 and FIG. 5 shows further examples of a device 1, much of which are identical to the second example shown in FIG. 2. Only the differences from the previous examples will therefore be discussed here; in other regards, reference is made to the description of FIG. 1. The examples of FIGS. 4 and 5 are different from the previous examples in that a mixer 25 is not provided in the device 1. Instead, the nitrogen reservoir 5 is connected directly through a cooling gas line 26 comprising heat sinks 22 to the cooling zone 5. The devices 1 furthermore comprise a flow channel 28, through which the cooling atmosphere 29 is circulated and in which a heat sink 22 for cooling the cooling atmosphere is arranged. The flow channel 28 can be situated additionally or alternatively below the conveying system for the printed circuit boards as well.

In the example represented in FIG. 4, a heat sink 22 and a conventional heat sink 30 are arranged in a flow channel 28, which is part of the cooling zone 15. The heat sink 22 is operated with liquid cooling gas from the nitrogen reservoir 5, and as far as possible all of the cooling gas reaches the heat sink 22 in liquid form. The conventional heat sink 30 is operated with water. The cooling atmosphere is circulated by fans (not shown) through the flow channel 28 and across the transport device 27, on which the printed circuit board modules are passed through the soldering system 12. The cooling gas vaporized in the heat sink 22 is supplied for inerting to the preheating zone 13 and the soldering zone 14. In this case, cooling of the cooling atmosphere 29 takes place in the flow channel 28 so that a uniform temperature distribution is achieved throughout the cooling zone 15, all of the enthalpy of vaporization in the liquid cooling gas being utilized.

The device 1 represented in FIG. 5 in addition to the heat sink 22 in the flow channel 28 also respectively comprises a heat sink 22 above and below the transport device 27, which are connected directly to the nitrogen reservoir 5. The cooling gas evaporated in these heat sinks 22 is also supplied to the preheating zone 13 and the soldering zone 14. In this way, the temperature in the cooling atmosphere 29 in the immediate vicinity of the printed circuit board modules can be varied and efficient heat transfer from the printed circuit board modules to the cooling gas is made possible.

Figure 6:
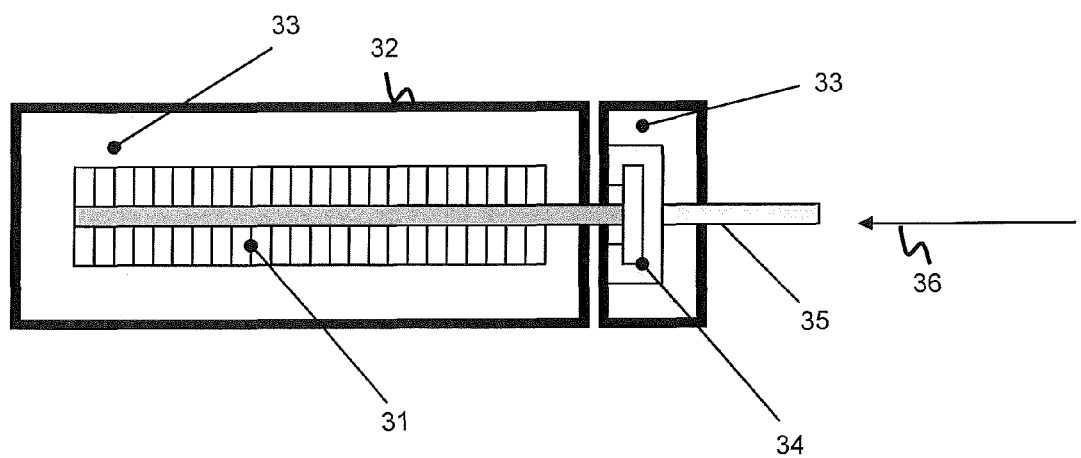
FIG. 6: shows a detail of a device for cooling printed circuit board modules.

FIG. 6 shows a detail in which a heat exchanger 31 is surrounded by a housing 32 in which a dry atmosphere 33 is present. By this dry atmosphere 33 condensation of water e.g. from the ambient atmosphere at the cold spots of the heat exchanger 31 is avoided. A similar housing 32 enclosing a dry atmosphere 33 can be used to protect pipe connectors 34 for connecting pipes 35 guiding cooling gas 36 on which condensation can occur. The dry gas can be off-gas generated by the evaporation of liquid cooling gas or the off-gas of the cooling zone 15.

Figure 7:
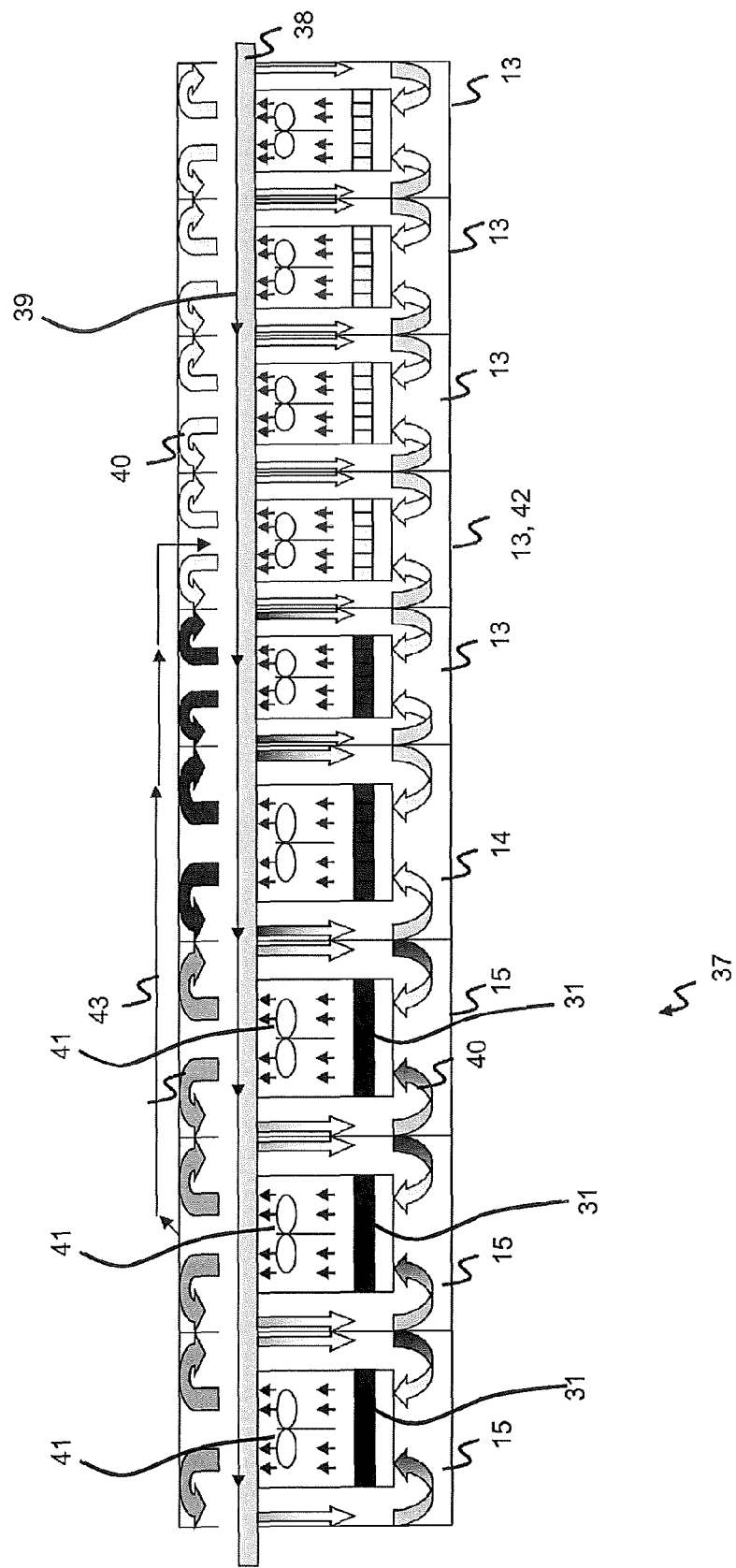
FIG. 7: shows an example of a soldering apparatus.

FIG. 7 displays an example of a soldering apparatus 37. Printed circuit boards (not displayed) are conveyed continuously through the soldering apparatus 37 by a conveyor 38 which moves the printed circuit boards in the conveying direction 39. The printed circuit boards pass in the conveying direction 39 several preheating zones 13, a soldering zone 14 (denoted as peak zone as well) and several cooling zones 15. The gas flow 40 through the zones 13, 14, 15 is shown as several arrows which are—for the sake of clarity—only in part shown with reference numerals. The temperature of the gas flow 40 is hottest in the soldering zone 14. It increases in the conveying direction 39 throughout the preheating zones 15 until reaching the soldering zone 14 and decreases downstream of the soldering zone 14 in the cooling zones 15.

The cooling zones 15 each comprise a heat exchanger 31 and a fan 41. In particular in the cooling zones 15 the individual heat exchangers 31 and/or the fans 41 in every cooling zone 15 can be controlled individually, e.g. by controlling the rotation frequency of the fan 41 and/or e.g. the temperature and/or the mass flow of the heat exchange medium in the heat exchanger 41. By controlling the fan 41 and/or the heat exchanger 41 in each cooling zone 15 individually it is possible to provide a well-defined cooling atmosphere in the cooling zones 15, in particular with a pre-determined temperature gradient in the cooling zones 15.

The off-gas from the cooling zones 15, in particular from the heat exchangers 41 is usually a gas, preferably a dry inert gas like e.g. nitrogen, which can be used for promoting inert conditions in the preheating zone(s) 13 or the soldering zone 14.

In a particular situation the off-gas 43 of the cooling zone 15 can be used to cool the gas flow 14 in at least one of the preheating zones 13 to generate a predetermined temperature profile in the preheating zones 13. In particular, the off-gas 43 can be used to provide a region in which the temperature remains mostly constant or increases with a smaller temperature gradient. In particular if this is used in a preheating zone 13 close to the soldering zone 14 in which the temperature is close to the temperature in the soldering zone 14 this zone can be understood as a slow down zone 42 in which the temperature increase is slowed down. This reduces the flow velocities of the gas flow 40 due to convection significantly, therefore stabilizing the atmospheric conditions in the preheating zones. If liquid nitrogen is used as a cooling gas the off-gas 43 comprises gaseous nitrogen with temperatures down to around the boiling temperature of nitrogen.

The method according to the invention and the device according to the invention advantageously allow highly efficient cooling of printed circuit board modules after the soldering process. After extraction from the cooling zone 15, the cooling gas may advantageously be used for inerting the soldering system 2.

Although throughout this document the terms "printed circuit boards" and "soldering" are used it is clear for the person skilled in the art that the approach discussed in this document can be transferred and adapted to other thermal processes and other components with all details described in this document.

It will be understood that many additional changes in the details, materials, steps and arrangements of parts, which have been herein described in order to explain the nature of the invention may be made by those skilled in the art within the principle and scope of the invention as expressed in the appended claims. Thus, the present invention is not intended to be limited to the specific embodiments in the examples given above.

LIST OF REFERENCES 1 device for cooling soldered printed circuit board modules
2 mixer
3 gas connection
4 liquid connection
5 nitrogen reservoir
6 evaporator
7 cooling gas outlet
8 liquid gas valve
9 gas valve
10 control unit
11 first temperature sensor
12 soldering system
13 preheating zone
14 soldering zone
15 cooling zone
16 cooling gas supply line
17 cooling zone spent gas outlet
18 inert gas supply line
19 heating means
20 second temperature sensor
21 preheating zone spent gas outlet
22 heat sink
23 conveyor belt
24 cooling gas valve
25 mixer
26 cooling gas line
27 transport device
28 flow channel
29 cooling atmosphere
30 conventional heat sink
31 heat exchanger
32 housing
33 dry atmosphere
34 pipe connectors
35 pipe
36 cooling gas
37 soldering apparatus
38 conveyer
39 conveying direction
40 gas flow
41 fan
42 slow down zone
43 off-gas

The invention claimed is:

1. A method for cooling soldered printed circuit board modules in a cooling zone of a soldering system, comprising:
   introducing at least one cooling gas comprising inert gas into the cooling zone, conveying the printed circuit boards continuously from a soldering zone of the soldering system into the cooling zone, wherein the cooling gas is passed through a heat sink which is assigned to the cooling zone, and is generated using liquid cooling gas wherein at least one of the following temperatures:
   the temperature in the cooling atmosphere,
   the temperature of the cooling gas vaporized in the heat sink and emerging from the latter,
   the temperature of the cooling gas during delivery into the cooling zone; and
   the temperature of the cooling gas during delivery into the heat sink, is used as a controlled variable for at least one of the following quantities:
   the volume flow rate of the cooling gas to be delivered into the cooling zone;
   the volume flow rate of cooling gas into the heat sink;
   the quantity fraction of liquid inert gas to be added when mixing the cooling gas; and
   the quantity fraction of gaseous inert gas to be added when mixing the cooling gas.

2. The method according to claim 1, wherein the liquid cooling gas is introduced into the cooling zone.

3. The method according to claim 1, wherein the cooling gas is obtained by mixing the gaseous and liquid inert gas.

4. The method according to claim 1, wherein the cooling gas is introduced into a cooling atmosphere of the cooling zone.

5. The method according to claim 1, wherein the cooling gas is introduced at a predeterminable temperature.

6. The method according to claim 1, wherein the cooling atmosphere cooled by the heat sink is circulated in the cooling zone.

7. The method according to claim 1, wherein the printed circuit board modules are conveyed above and/or below the heat sink/heat sinks.

8. The method according to claim 1, wherein at least one of the following elements: at least one fan is being assigned to a specific area of the cooling zone and at least one heat sink to cool the cooling atmosphere provided to the cooling zone are controlled to provide a cooling atmosphere in the cooling zone with a predetermined temperature gradient.

9. The method according to claim 1, wherein the cooling gas, after at least one of the following flow paths:
   after flowing through the cooling zone and
   after flowing through the at least one heat sink,
   is fed to at least one of the following zones as inert gas:

a soldering zone, in which a soldering process is carried out on the printed circuit board modules; and a preheating zone, in which the printed circuit board modules are preheated before reaching the soldering zone.

10. The method according to claim 1, wherein at least one of the following gases is used as the inert gas:

nitrogen;
argon;
helium and
carbon dioxide.

* * * * *